United States Patent
Blon

(10) Patent No.: US 7,368,987 B2
(45) Date of Patent: May 6, 2008

(54) CIRCUIT CONFIGURATION HAVING A FEEDBACK OPERATIONAL AMPLIFIER

(75) Inventor: Thomas Blon, Jengen (DE)

(73) Assignee: National Semiconductor Germany AG, Unterhaching (DE)

( * ) Notice: Subject to any disclaimer, the term of this patent is extended or adjusted under 35 U.S.C. 154(b) by 63 days.

(21) Appl. No.: 11/524,168

(22) Filed: Sep. 20, 2006

(65) Prior Publication Data

US 2007/0075769 A1   Apr. 5, 2007

(30) Foreign Application Priority Data

Sep. 30, 2005   (DE) ............... 10 2005 047 171

(51) Int. Cl.
*H03F 1/36* (2006.01)
(52) U.S. Cl. .......................... 330/86; 330/260
(58) Field of Classification Search ............... 330/86, 330/51, 260, 282, 294
See application file for complete search history.

(56) References Cited

U.S. PATENT DOCUMENTS

| | | | |
|---|---|---|---|
| 6,288,669 B1 | 9/2001 | Gata | |
| 6,768,374 B1 * | 7/2004 | Lee | 330/9 |
| 7,002,408 B2 * | 2/2006 | Roos et al. | 330/86 |
| 7,315,199 B2 * | 1/2008 | Oishi | 327/553 |

OTHER PUBLICATIONS

Paul Horowitz et al., "Feedback and Operational Amplifiers, Chapter 4", The Art of Electronics, Second Edition, Cambridge University Press, 1980, 1989, pp. 175-195.

Ulrich Tietze et al., "6 Der Operationsverstärker", Advanced Electronic Circuits, Springer-Verlag Berlin Heidelberg, 1969, 1971, 1974, 1978, and 1980, pp. 93-108; English Summary included.

* cited by examiner

*Primary Examiner*—Henry Choe
(74) *Attorney, Agent, or Firm*—Pearne & Gordon LLP

(57) ABSTRACT

The present invention relates to a circuit configuration (10) having a feedback operational amplifier (AMP) for amplifying an input signal (Vin) input into the circuit arrangement (10) and outputting the amplified input signal as an output signal (Vout). In order to be able to change the circuit amplification (Vout/Vin) easily and reliably in the circuit configuration (10) and simultaneously keep an impairment of the output signal (Vout) caused by noise relatively low, capacitance values (Cb, C) of the coupling path (12) and of the feedback path (14) are adjusted simultaneously to one another correlated in a special way.

12 Claims, 2 Drawing Sheets

CIRCUIT CONFIGURATION HAVING A FEEDBACK OPERATIONAL AMPLIFIER

BACKGROUND OF THE INVENTION

1. Area of the Invention

The present invention relates to a circuit configuration having a feedback operational amplifier for amplifying an input signal input into the circuit configuration and outputting the amplified input signal as an output signal.

Circuit configurations of this type are known in manifold forms. Solely for exemplary purposes, reference is made to the textbooks "U. Tietze, Ch. Schenk, Halbleiter-Schaltungstechnik [Semiconductor Circuit Technology], 5th Edition, Springer-Verlag, 1980", in particular pages 93 through 108, and "Paul Horwitz, Winfield Hill, The Art of Electronics, Second Edition, Cambridge University Press, 1989", in particular pages 175 through 195.

The term "operational amplifier" as defined in the present invention is to be understood very broadly as a configuration capable of amplifying an electrical variable such as a voltage. In particular, it refers to amplifiers, for example, in which a signal applied to the amplifier input is provided having relatively high voltage amplification at the amplifier output. This open amplification ("open loop again") may be in the magnitude of approximately $10^4$ through $10^5$, for example.

An essential characteristic of the circuit configuration according to the species is that the circuit amplification, i.e., the ratio between output signal and input signal, is practically completely independent of this open amplification (except for transient occurrences) and is solely predefined by an additional (external) configuration of the operational amplifier.

The term "feedback network" in the circuit configuration according to the species refers to any such configuration of the operational amplifier which exerts an influence on the resulting circuit amplification. In the simplest case, the feedback network comprises a configuration of one or more (ohmic) resistors. Alternatively or additionally, other components such as capacitors and/or inductors may be provided to produce the feedback network. Very generally, these components provided to produce the feedback network are thus identified in the following as impedances.

2. Description of the Prior Art

There are applications in which a circuit configuration is required in which the circuit amplification is changeable or even continuously changeable. In order to achieve this, essentially two approaches are followed in the prior art.

One possibility is to connect a damping element, whose damping is changeable, upstream of an amplifier having a fixed predefined amplification.

Another possibility is to implement amplification-determining resistors of the feedback network on an operational amplifier by MOS transistors, which are operated in the triode range. The effective resistance of these transistors may be changed continuously by a corresponding change of activation signals (gate source voltages).

Both achievements of the object are not satisfactory in all applications. In the first achievement of the object, nonlinearities typically occur in the damping element, for example, which have an effect on the circuit amplification.

In the second achievement of the object, above all, a disadvantage is the restricted linearity of the resistors implemented by MOS transistors in the triode range and, accompanying this, a reduced linearity of the circuit configuration.

In addition, a further disadvantage of the known circuit configurations is that their output signal is often impaired by interference signals, particularly noise unavoidably occurring at the input side of the operational amplifier, for example. In a resistive feedback amplifier configuration, the extent of the "white noise" (flat curve of the frequency-dependent noise output), which is at least to be observed as dominant, such as the noise output or the noise voltage occurring at a resistor element, is a function of the relevant resistance values(s). A greater resistance value results in a greater effective noise voltage. The use of resistor elements having resistance values in the magnitude of approximately 100 $\Omega$ or less is to be derived from this law for a circuit configuration implemented in CMOS technology for many applications (if noise up to a few $nV/(Hz)^{0.5}$ is to be permitted). Although resistance values this low may be implemented in CMOS technology, it is extremely difficult to change resistance values of this type in operation at great precision or with high linearity in relation to an activation signal in order to change the circuit amplification precisely during operation of the circuit configuration.

OUTLINE OF THE INVENTION

It is an object of the present invention to provide a circuit configuration of the type cited at the beginning in which the circuit amplification may be changed easily and reliably and simultaneously impairment of the output signal as a result of noise may be kept relatively low.

This object is achieved according to the present invention in that the coupling path comprises a coupling capacitor having changeable capacitance value, referred to in the following as Cb, and the feedback path comprises a feedback capacitor having changeable capacitance value, referred to in the following as C, adjustment means being provided for simultaneously changing the to capacitance values Cb and C, so that the following relationship applies:

$$Cb = k\ a\ (N+b\ x)\ Cu, \text{ and}$$

$$C = (c\ N - d\ x)\ Cu.$$

For this purpose:
k, a, b, c, and d identify permanently predefined parameters,
Cu identifies a permanently predefined capacitance value,
N identifies a predefined natural number, and
x identifies a natural number which may be changed in a range from 0 through N during the change.

In the present invention, both the coupling path and also the feedback path each comprises corresponding coupling capacitors having changeable capacitance values. These capacitance values Cb and C are changed by the adjustment means simultaneously and especially correlated (as specified in claim 1).

A change of capacitance values of this type to change the circuit amplification may be implemented in many ways in practice.

Resistance noise may be avoided both in the coupling path and also in the feedback path through impedances selected as capacitors.

In one embodiment, the parameters a, b, c, and d at least approximately fulfill the following conditions: a=c and b=d=a-1. These conditions have been shown to be advantageous if a more or less linear relationship between the parameter x and a logarithm of the resulting circuit amplification is to be ensured. Such a linearity is desirable in many applications.

In a refinement of the latter parameterization, the following relationship applies—at least approximately—for the capacitance values Cb and C: Cb=2 N Cu+2 x Cu and C=N Cu+(N−x) Cu. This behavior of the capacitance values Cb and C as a function of x is obtained on the basis of the description specified above through the following selection of the parameters k, a, b, c, and d, for example: k=1, a=2, b=1, c=2, and d=1.

If the feedback network is formed by a coupling path and a feedback path of the latter specified type, the following relationship results as the circuit amplification A:

$$A=Vout/Vin=2\ (N\ Cu+x\ Cu)/(2\ N\ Cu-x\ Cu).$$

If x, also referred to in the following as the amplification code, is varied in a range from 0 through N (natural numbers), the circuit amplification A varies from 1 through 4, i.e., from 0 dB through 12 dB. A linear relationship advantageously results between the logarithm of the circuit amplification A and the amplification code x. The quantization error resulting due to the finite nature of the total number N+1 of possible codes is smaller the larger N is selected for this purpose.

If the above-mentioned conditions a=c and b=d=a−1 are met, a minimum amplification Amin (for x=0) and a maximum amplification Amax (for x=N) may be established through appropriate selection of the parameters k and a.

The parameter k determines the minimum amplification Amin.

The following values are cited as examples:

| k: | Amin: |
|---|---|
| 0.10 | −20 dB |
| 0.25 | −12 dB |
| 1.00 | 0 dB |
| 4.00 | +12 dB |
| 10.0 | +20 dB |

The parameter a determines the maximum amplification or more precisely the difference of the (logarithmic) amplifications Amax −Amin (="amplification range"). The following values are cited as examples:

| a: | Amax-Amin: |
|---|---|
| 2 | 12 dB |
| 4 | 24 dB |
| 8 | 36 dB |

In a preferred embodiment, the coupling path comprises multiple coupling branches connected to one another in parallel for changing Cb, each of which comprises a series circuit made of a transistor and a capacitor which is connectable and disconnectable via the transistor, whose capacitance values are permanently predefined in each case. Therefore, the desired change of the capacitance values Cb in the coupling path may be implemented using an especially simple circuit. For the above-mentioned refinement of the capacitance adjustment having Cb=2 N Cu+2 x Cu and C=N Cu+(N−x) Cu, for example, the connectable and disconnectable capacitors may each identically have the permanently predefined capacitance value 2 Cu.

Correspondingly, it is also favorable in regard to the feedback path if the feedback path comprises multiple feedback branches connected to one another in parallel for changing C, each of which comprises a series circuit made of a transistor and a capacitor connectable and disconnectable via the transistor, whose capacitance values are each predefined. For the above-mentioned refinement having Cb=2 N Cu+2 x Cu and C=N Cu+(N−x) Cu, for example, the connectable and disconnectable capacitors in the feedback path may each identically have the permanently predefined capacitance value Cu.

In the above-mentioned embodiment, the circuit amplification may be changed by alternately connecting or disconnecting capacitive coupling branches. If integration elements are connected upstream from each of the control inputs of the transistors used for this purpose, e.g., the gates of field-effect transistors, a certain chronological smoothing of the curve of the circuit amplification A upon connection or disconnection of a capacitor (e.g., of the value 2 Cu or Cu) may especially advantageously be achieved. Specifically, the integration element particularly ensures that even in the event of a sudden change of the affected activation signal, the affected capacitor is not also suddenly disconnected or connected. This has a corresponding "evening" effect on the resulting circuit amplification A.

There are manifold possibilities for implementing the integration element to achieve the effect explained above. In an especially simple and preferred embodiment, the integration element is implemented as an integrator. This is to mean that this element provides a signal at its output which represents the chronological integral of the signal supplied at the input, this integrator output signal being delimited by the output signal range provided for the integrator, of course.

A common concept for implementing an integrator which is usable here, for example, is to use a voltage-controlled current source for charging and discharging a permanently predefined capacitor and to use the voltage applied to this integrator capacitor as the integrator output signal.

In an especially simple embodiment, the integration elements each have a permanently predefined integration or smoothing characteristic. For example, if implemented as integrators, a permanently predefined integration time constant may be provided. The integration characteristic may be tailored in particular to the change speeds of the circuit amplification to be expected in practice (e.g., changeover frequency in digital switching signals). Thus, especially efficient evening of the continuous amplification change may be achieved in practical application. However, it is not to be precluded that the individual integration elements may be different from one another or may be provided with a changeable integration characteristic.

In a preferred embodiment, the integration elements are impinged by digital switching signals (switching signals which are always switched to one of multiple (e.g., two) discrete signal values). This makes the circuit configuration especially of interest in "digital environments" in particular, e.g., in a "mixed-signal chip" in particular. Such activation signals which may be changed over more or less suddenly may be generated by a digital data processing unit such as a microcontroller, for example. In the scope of the present invention, these switching signals are then advantageously supplied "in smoothed form" to the control inputs of the switching transistors, so that in spite of discrete (digital) amplification adjustments, abrupt changes of the circuit amplification do not result, which would act as sampling effects in the output signal spectrum of the circuit configuration, for example.

In a preferred embodiment, the desired circuit amplification is coded by the status of multiple digital switching signals, a single-step code being used, so that upon transition from one code word to the next following code word, only one activation signal state always changes. For this purpose, for example, for a monotone change of the circuit amplification, switching signals applied to the transistor control inputs or the integration elements (if provided) are changed over in sequence. (one after another).

In a refinement, at least one integration element provided for the coupling path is coupled to at least one integration element provided for the feedback path in such a way that connecting the relevant capacitor in the coupling path is connected to disconnecting the relevant capacitor in the feedback path and vice versa. Therefore, in many cases the performance characteristics of the circuit configuration, in particular its linearity characteristics, for example, may be improved further. In addition, the correlation between the changes of the capacitance values in the coupling path (Cb) and, in addition, in the feedback path (C) provided according to the present invention may be implemented using a simple circuit.

In the latter regard, it is also favorable if the coupling path and/or the feedback path comprises a coupling branch which is formed by a capacitor having a permanently predefined capacitance value (particularly corresponding to the value 2 N Cu or N Cu, for example).

Finally, it is often advantageous in practice if the feedback path comprises a feedback branch which is formed by a resistor element, particularly an ohmic resistor. Specifically, using such a resistor element, the common mode voltage of the operational amplifier may particularly be adjusted. For this purpose, an ohmic resistor having a resistance value of more than 1 MΩ typically suffices. The influence of such a resistor on the resulting circuit amplification A may often be neglected as a function of the dimensioning of the capacitive elements of the feedback network (and the frequency of the input signal Vin). This is also true in practice for the influence of the resistive impedance contributions of the above-mentioned switching transistors in the individual coupling branches.

The circuit configuration according to the present invention may advantageously implement a functional block in a microelectronic integrated circuit, for example, in particular in a "mixed-signal chip". The transistors provided for the external configuration of the operational amplifier (and also transistors provided in the operational amplifier) may advantageously, be implemented as field-effect transistors, for example (e.g., in CMOS technology).

A use of the circuit configuration described which is preferred in the scope of the present invention comprises signal conditioning in a measuring method. A use especially of interest exists for measuring methods in which the signals to be measured are based on reception signals whose amplitude changes over time because of the system, for example. These include, for example, ultrasonic and radar applications in which the reception signal is damped in accordance with the signal propagation distance.

BRIEF DESCRIPTION OF THE DRAWING

The present invention is described further in the following on the basis of exemplary embodiments with reference to the attached drawing.

DESCRIPTION OF THE PREFERRED EMBODIMENTS

Figure 1:
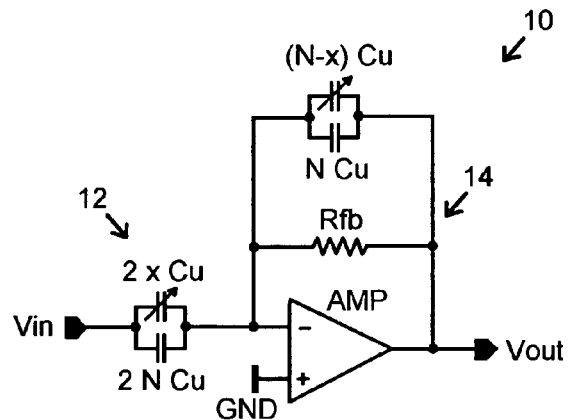
FIG. 1 schematically shows a circuit configuration for amplification change in a capacitive feedback, inverting amplifier.

On the left, FIG. 1 shows a circuit configuration identified overall by 10 having a circuit input for an input signal Vin to be amplified and a circuit output to output the amplified input signal as an output signal Vout.

The circuit configuration 10 comprises an operational amplifier AMP, whose amplifier input is impinged in the way shown with the input signal Vin and at whose amplifier output the amplified input signal is provided, the operational amplifier being fed back using a feedback network to define the circuit amplification (=Vout/Vin).

The feedback network comprises a coupling path 12 running from a circuit input terminal to an inverting amplifier input terminal and a feedback path 14 running from an amplifier output terminal to the inverting amplifier input terminal.

The coupling path 12 and the feedback path 14 each comprise a parallel circuit made of capacitive coupling branches.

A first coupling branch, which is below in each case in FIG. 1, comprises a capacitor having a permanently predefined capacitance value, namely 2N times a predefined capacitance value Cu (N being a permanently predefined natural number) for the coupling path 12, and N times this value Cu for the feedback path 14.

The other coupling branch, which is above in each case in FIG. 1, in contrast, comprises a capacitor having a changeable capacitance value, this capacitance value being equal to 2 x Cu for the coupling path 12 and being equal to (N−x) Cu for the feedback path 14. For this purpose, x identifies an amplification code ("gain code").

Using adjustment means (not shown in FIG. 1), the capacitance values are accordingly adjusted simultaneously (correlated to one another) as a function of the amplification code x to change the circuit amplification A (=Vout/Vin). During this change of the circuit amplification A, x is varied as an integer in a range from 0 through N.

In the exemplary embodiment shown, the feedback path 14 additionally also comprises an ohmic resistor Rfb (a few MΩ), whose influence on the circuit amplification A in the operating frequency range of the circuit configuration 10 is practically negligible in relation to the impedance of the parallel circuit of the capacitive feedback branches. In the example shown, the frequency of the input signal Vin is greater than 1 MHz in operation, for example. The resistor Rfb is thus used solely to adjust the common mode voltage of the operational amplifier AMP.

The value of the capacitance of the coupling path 12 (sum of the capacitors connected in parallel) resulting upon a specific selection of x is also referred to in the following as Cb ("coupling capacitance"). The value of the capacitance of the feedback path 14 ("feedback capacitance") resulting as the sum of the capacitive feedback branches is also referred to in the following as C.

Figure 2:
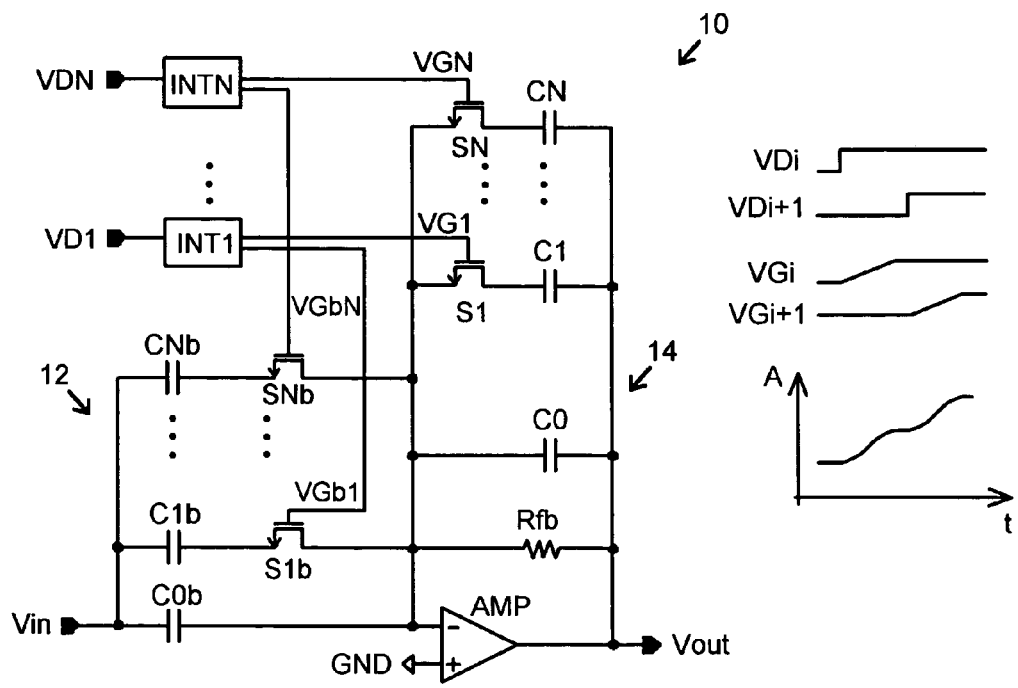
FIG. 2 shows a concrete embodiment of the circuit configuration of FIG. 1.

FIG. 2 shows a concrete implementation of the circuit configuration illustrated in FIG. 1 as an example.

In this implementation, the coupling path 12 is formed by a capacitor C0b having a permanently predefined capacitance value 2 N Cu and by multiple (number N) coupling branches connected in parallel to one another and in parallel to the capacitor C0b, each of which comprises a series circuit made of a transistor Sib (i=1 . . . N) and a capacitor Cib (i=1 . . . N), which may be connected and disconnected via the transistor, whose capacitance value is equal to the permanently predefined capacitance value 2 Cu. Using this configuration, it is obviously easily possible to adjust the capacitance value of the coupling path 12 in the desired way as Cb=2 N Cu+2 x Cu, x corresponding to the number of the transistors Sib switched to conduct.

In addition to the resistive feedback branch Rfb, the feedback path 14 is formed by a parallel circuit made of a capacitor C0 having a permanently predefined capacitance value N Cu and multiple (number N) feedback branches connected to one another in parallel, each of which comprises a series circuit made of a transistor Si (i=1 . . . N) and a capacitor Ci (i=1 . . . N), which may be connected and disconnected via the transistor, whose capacitance value is equal to the permanently predefined capacitance value Cu. Correspondingly, using this configuration, the feedback capacitance C may be adjusted in the desired way as C=N Cu+(N−x) Cu, x corresponding to the number of the transistors Si switched to block.

The activation signals VGbi (i=1 . . . N) supplied to the transistors Sib in the coupling path 12 at their control inputs (here: gates of field-effect transistors) are provided as output signals of a corresponding number of integration elements INTi (i=1 . . . N). At the input, the integration elements INT1, . . . INTN are each impinged by digital switching signals VDi (i=1 . . . N).

A special feature of the circuit configuration 10 shown is thus that to change the circuit amplification A defined by the feedback network 12, 14, the capacitors C1b . . . . CNb are alternately connectable and disconnectable to the coupling path 12 via one assigned transistor S1b, . . . SNb each, the corresponding digital switching signals VD1, . . . VDN not being supplied directly to the gates of the transistors, implemented as field-effect transistors here, but rather via the interposed integration elements INT1, . . . INTN. The individual series circuits, each made of a capacitor Cib (i=1 . . . N) and a transistor Sib (i=1 . . . N), thus form coupling branches, which may be connected and disconnected selectively to and from the coupling path 12 through a corresponding changeover of the activation signals VD1, . . . VDN.

In the coupling path 12 shown, the value of the coupling capacitance Cb results as the sum of the capacitance value of the coupling branch C0b always present and the capacitance values of the currently connected capacitors C1b , . . . CNb.

The feedback path 14 is constructed very similarly, specifically, it also comprises a capacitor C0 having a permanently predefined capacitance value N Cu as well as multiple feedback branches connected to one another in parallel, each of which comprises a series circuit made of a transistor Si (i=1 . . . N) and a capacitor Ci (i=1 . . . N), which may be connected and disconnected via the transistor, whose capacitance value is equal to the permanently predefined capacitance value Cu. The output signals of the integration elements INT1, . . . INTN are supplied in complementary form (originating from a second output terminal of the integration elements) to the gates of the transistors S1, . . . SN in the feedback path 14. Through this complementarity, each integration element (INTi) provided for the coupling path 12 is coupled to each integration element (INTi) provided for the feedback path 14 in such a way that connecting the relevant capacitor C1b . . . CNb in the coupling path 12 is connected to a disconnection of the relevant capacitor C1, . . . CN in the feedback path 14 and vice versa.

For a monotone change of the circuit amplification A, in the exemplary embodiment shown, a sequential changeover of the digital switching signals of VD1, . . . VDN is provided. Even if the individual activation signals suddenly change their state at specific times, this does not at all result in a corresponding abrupt change of the overall impedance in the coupling path 12 and in the feedback path 14 and thus in a corresponding abrupt change of the circuit amplification, since the individual switching transistors S1, . . . SN are not activated directly, but rather via the integration elements INT1, . . . INTN.

This advantageous evening of the amplification change is illustrated in the right part of FIG. 2. Curves of various variables as a function of the time t are shown there.

For this purpose, it is assumed that a specific switching signal VDi (i=1 . . . N) changes its state at a specific time. A further switching signal VDi+1 also changes following this. At the outputs of the assigned integrators, the signal curves identified by VGi and VGi+1 then result. The circuit amplification A does not change abruptly in steps but rather only gradually due to the "soft" connection (or disconnection) of the affected coupling branches.

Notwithstanding the exemplary embodiment shown, the transmission function of the integration elements INT1, . . . INTN may also be selected (or tailored to the characteristic of the switching transistors) so that during the sequential changeover of the activation signals VG1, . . . VGN, an essentially linear change of the circuit amplification A occurs (viewed as a function of the time t).

For this purpose, individual feedback branches are each coupled to one of the coupling branches in such a way that branches combined into pairs are always activated or deactivated in opposite directions simultaneously. In the example shown, this functional coupling is implemented by integration elements INT1, . . . INTN, each of which has two outputs and thus activates the switching transistors of the assigned branches simultaneously. This coupling is provided so that a connection of the relevant capacitor C1, . . . CN in the feedback path 14 is accompanied by a disconnection of the relevant capacitor C1b , . . . CNb in the coupling path 12 and vice versa.

In the exemplary embodiment shown a "single-ended" configuration of the circuit configuration 10 is selected, in which the signals Vin and Vout provided as voltages are each in relation to a shared potential (ground potential GND). Notwithstanding the example shown, the circuit configuration may also be configured differentially.

Figure 3:
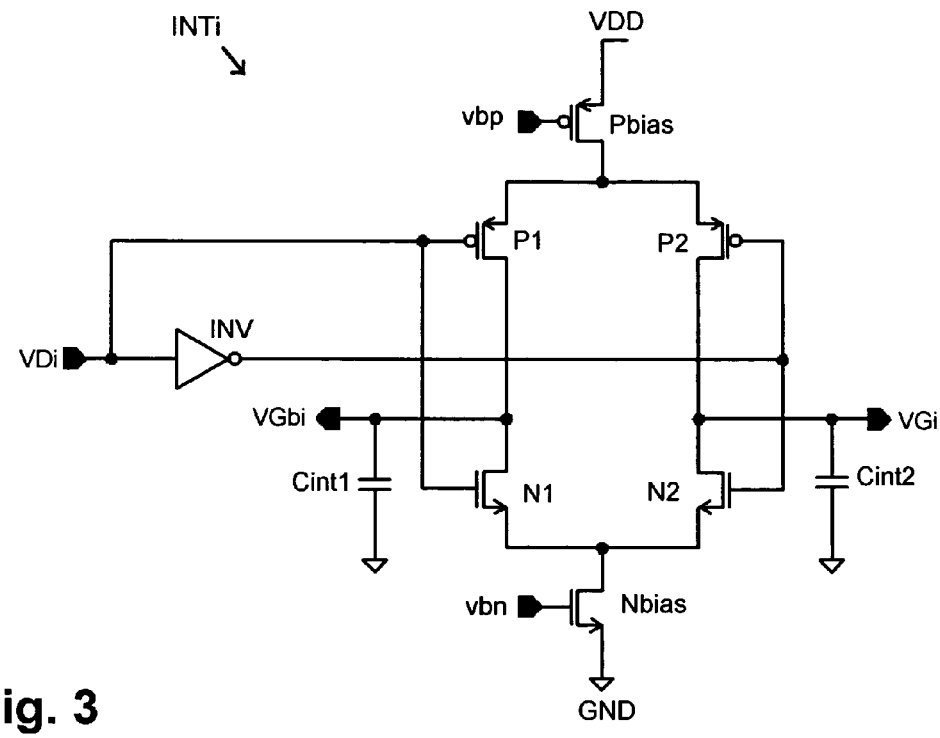
FIG. 3 illustrates an implementation of an integrator which is usable for the circuit configuration of FIG. 2.

FIG. 3 shows the circuit diagram of an integrator INTi, as may be used, for example, to implement the integrators INT1, . . . INTN illustrated in FIG. 2.

As shown, the integrator INTi comprises a series circuit made of transistors Pbias, P, N, Nbias, which is situated between a positive supply potential VDD and the ground potential GND. The output signal of this inverter INV is supplied as the activation signal to the control inputs of the transistors P1, N1 of different line types. Depending on the (binary) state of the switching signal VDi only one of the two switching transistors P1, N1 always conducts, so that a capacitance Cint situated between a middle tap of these transistors and the ground potential GND is either charged via the transistor P1 or discharged via the transistor N1. The charging procedure and the discharging procedure end as soon as the voltage applied to the capacitor corresponds to the positive supply potential VDD or the ground potential GND. The speed at which the capacitor Cint is charged and discharged is predefined in this case by the transistors Pbias, Nbias used as current setting transistors. This current preset is performed by impinging the control inputs of these transistors Pbias, Nbias with corresponding adjustment potentials vbp and vbn. These adjustment potentials vbp, vbn may have a constant value, for example, the transistors being operated essentially as constant current sources in the saturation range.

The binary switching signal VDi is also supplied inverted (using an inverter INV) to the control inputs of additionally provided switching transistors P2, N2. The series circuits P2, N2 and P1, N1 are situated parallel to one another for this purpose and are connected via a current setting transistor Pbias to VDD and via a current setting transistor Nbias to the ground potential GND. A middle tap of the series circuit P2, N2 leads to a first terminal of a capacitor Cint2, whose second terminal is connected to the ground potential GND. The overall construction thus essentially corresponds to a double embodiment of an integrator, complementary output signals VGi and VGbi being generated on the basis of the input switching signal VDi. The former signals thus ensure the simultaneous, but complementary activation of the two transistors Si, Sib (i=1 ... N) connected to the integrator.

In the circuit configuration 10, in the event of a constant switching signal, the assigned switching transistor (at latest after a specific delay predefined by the integration element) either essentially conducts or essentially blocks, so that no noticeable losses occur at the transistors in this stationary state. The changeover of the transistor states is performed through corresponding variation of gate-source voltages, which are provided at the output of the integration elements. A sudden change of these activation voltages is thus avoided. Since every switching transistor finally remains completely turned on or turned off after passing through the state change, the overall amplifier configuration thus has linearity properties which are essentially independent of the properties of the transistors and are thus especially good. The impedances of the transistors themselves may accordingly be negligible in practice in relation to the impedances which are thus activated and deactivated. Instead of the NMOS switches shown in the examples, for example, PMOS switches or a combination thereof may also be used.

The smoothing effect of the upstream integrators INT1, ... INTN is essential for the function of the circuit configuration 10 in FIG. 2, which may be achieved especially easily using the integrator configuration INTi shown in FIG. 3. Notwithstanding this example, upstream integration elements may also be implemented differently.

In the circuit configuration 10 described, the circuit amplification A may be changed practically continuously in an easy and reliable way. Simultaneously, impairment of the output signal Vout caused by noise remains relatively low.

Figure 4:
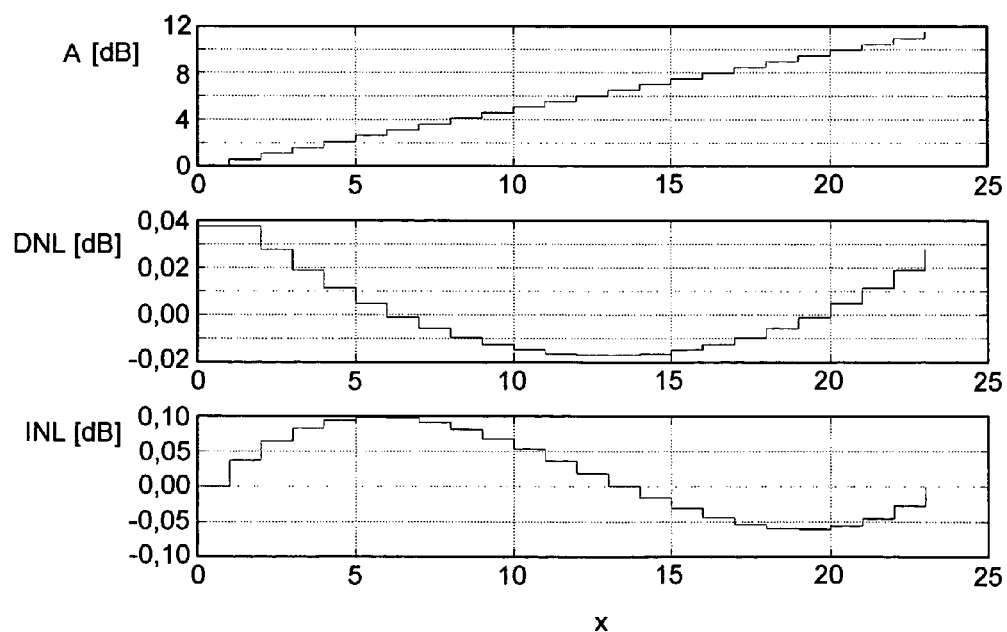
FIG. 4 shows the circuit amplification A resulting for the circuit configuration of FIG. 1 and the linearity error (DNL and INL), each as a function of the amplification code x.

The outstanding linearity properties of the circuit configuration 10 are shown in FIG. 4.

The circuit amplification A, a differential nonlinearity DNL, and an integral nonlinearity INL are each plotted in FIG. 4 as a function of the amplification code x, which is varied in this example in a range from 0 through 23 (N=23). For many applications, a total number of possible different amplification codes (N+1) of at least 10, particularly at least 20, is sufficient.

The invention claimed is:

1. A circuit configuration having a circuit input for an input signal (Vin) to be amplified and a circuit output to output the amplified input signal as an output signal (Vout), the circuit configuration comprising an operational amplifier (AMP), whose amplifier input is impinged by the input signal (Vin) to be amplified and at whose amplifier output the amplified input signal (Vout) is provided, the operational amplifier (AMP) being fed back using a feedback network (12, 14) to define the circuit amplification, and the feedback network (12, 14) comprising a coupling path (12), which is situated between a circuit input terminal and an inverting amplifier input terminal, and a feedback path (14), which is situated between an amplifier output terminal and the inverting amplifier input terminal, characterized in that the coupling path (12) comprises a coupling capacitor having a changeable capacitance value, referred to in the following as Cb, and the feedback path (14) comprises a feedback capacitor having a changeable capacitance value, referred to in the following as C, adjustment means being provided for simultaneously changing the two capacitance values Cb and C, so that the following relationship applies:

$Cb = k\ a\ (N+b\ x)\ Cu$ and $C = (c\ N - d\ x)\ Cu$, k, a, b, c, and d identifying permanently predefined parameters, Cu identifying a permanently predefined capacitance value, N identifying a predefined natural number, and x identifying a natural number which may be changed in a range from 0 through N during the change.

2. The circuit configuration according to claim 1, wherein the parameters a, b, c, and d at least approximately fulfill the following conditions: a=c and b=d=a−1.

3. The circuit configuration according to claim 2, wherein the following relationship applies for the capacitance values Cb and C: $Cb = 2\ N\ Cu + 2\ x\ Cu$ and $C = N\ Cu + (N-x)\ Cu$.

4. The circuit configuration according to claim 1, wherein the coupling path (12) comprises multiple coupling branches connected in parallel to change Cb, each of which comprises a series circuit made of a transistor and a capacitor connectable and disconnectable via the transistor, whose capacitance values (2 Cu) are each permanently predefined.

5. The circuit configuration according to claim 1, wherein the feedback path (14) comprises multiple feedback branches connected in parallel to change C, each of which comprises a series circuit made of a transistor and a capacitor connectable and disconnectable via the transistor, whose capacitance values (Cu) are each permanently predefined.

6. The circuit configuration according to claim 4, wherein an integration element (INT1-INTN) is connected upstream of each of the control inputs of the transistors.

7. The circuit configuration according to claim 6, wherein the integration element (INT1-INTN) is implemented as an integrator.

8. The circuit configuration according to claim 6, wherein the integration elements (INT1-INTN) are impinged by digital switching signals (VD1-VDN).

9. The circuit configuration according to claim 6, wherein at least one integration element (INT1-INTN) provided for the coupling path (12) is coupled to at least one integration element (INT1-INTN) provided for the feedback path (14) in such a way that a connection of the effective impedance (C1b, ... CNb) in the coupling path (12) is connected to a disconnection of the affected impedance (C1, ... CN) in the feedback path (14) and vice versa.

10. The circuit configuration according to claim 1, wherein the coupling path (12) comprises a coupling branch, which is formed by a capacitance having a permanently predefined capacitance value (2 N Cu).

11. The circuit configuration according to claim 1, wherein the feedback path (14) comprises a feedback branch, which is formed by a capacitor having a permanently predefined capacitance value (N Cu).

12. The circuit configuration according to claim 1, wherein the feedback path (14) comprises a feedback branch which is formed by a resistor element (Rfb).

* * * * *